United States Patent
Xu et al.

(10) Patent No.: US 8,289,056 B2
(45) Date of Patent: Oct. 16, 2012

(54) PHASE DETECTOR CIRCUIT FOR AUTOMATICALLY DETECTING 270 AND 540 DEGREE PHASE SHIFTS

(75) Inventors: Min Xu, Mountain View, CA (US);
Ming-Ju E. Lee, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 12/327,787

(22) Filed: Dec. 3, 2008

(65) Prior Publication Data

US 2010/0134161 A1    Jun. 3, 2010

(51) Int. Cl.
*H03L 7/06* (2006.01)
(52) U.S. Cl. .................. 327/156; 327/159; 375/373
(58) Field of Classification Search .............. 327/158, 327/157, 156
See application file for complete search history.

(56) References Cited

U.S. PATENT DOCUMENTS

| | | | | |
|---|---|---|---|---|
| 6,292,408 B1 * | 9/2001 | Kawashima et al. | .... | 365/189.11 |
| 7,010,014 B1 * | 3/2006 | Percey et al. | ........ | 375/130 |
| 7,453,296 B2 * | 11/2008 | Masenas | ........ | 327/158 |
| 7,863,960 B2 * | 1/2011 | Wang et al. | ........ | 327/291 |
| 2007/0241798 A1 * | 10/2007 | Masenas | ........ | 327/158 |
| 2008/0054962 A1 * | 3/2008 | Masenas | ........ | 327/157 |
| 2008/0054963 A1 * | 3/2008 | Masenas | ........ | 327/157 |

* cited by examiner

*Primary Examiner* — Ryan Jager
(74) *Attorney, Agent, or Firm* — Volpe and Koenig, P.C.

(57) ABSTRACT

Embodiments include implementing a phase detector for a delay-locked loop (DLL) circuit that is operable to detect substantially 270 degree and substantially 540 degree phase differences between two clock signals. In an embodiment, a DLL circuit comprises a delay line receiving a system clock signal and generating a substantially 270 degree phase shifted clock signal and a substantially 540 degree phase shifted clock signal, a phase detector receiving the system clock signal and the substantially 270 degree phase shifted clock signal, and configured to generate corresponding up and down signals upon detection of a phase shift of substantially 270 degrees between the system clock signal and the substantially 270 degree phase shifted clock signal, a charge pump coupled to the phase detector, and configured to receive the up and down signals and generate a control signal responsive to thereto, and a regulator circuit to receive the control signal from the charge pump and generate a voltage control signal to the delay chain to control delay of the system clock signal.

9 Claims, 4 Drawing Sheets

300

| PHASE DIFF. BETWEEN CLK540 AND CLK0 | 0-180 | 180-360 | 360-540 | 540-720 | 720-900 |
|---|---|---|---|---|---|
| CLK270 SAMPLE (d1) | 1 | 1 | 0 | 0 | 1 |
| CLK540 SAMPLE (d2) | 1 | 0 | 1 | 0 | 1 |
| PHASE DETECTOR OUT | DOWN | DOWN | DOWN | UP | DOWN |
|  |  |  |  | nor(d1,d2) |  |

FIG. 3

PHASE DETECTOR CIRCUIT FOR AUTOMATICALLY DETECTING 270 AND 540 DEGREE PHASE SHIFTS

TECHNICAL FIELD

The disclosed embodiments relate generally to phase detectors, and more specifically to methods and systems for detecting 270 and 540 degree phase differences.

BACKGROUND OF THE DISCLOSURE

Digital integrated circuit (IC) devices that interface to high-speed memory interfaces typically receive data and strobe clocks simultaneously. In order to ensure timing and guarantee data-capture, the incoming clocks need to be phase adjusted, usually by 90 degrees. A phase detector is a device whose output represents the phase difference between the two oscillating input signals. A reference signal is applied as one input, and the phase or frequency modulated signal is applied to the other input. The phase detector takes the two inputs and generates an output signal that comprises a signal that is proportional to the phase difference between the two inputs.

A delay-locked loop (DLL) is a digital circuit that employs phase detection to change the phase of a clock signal, usually to enhance the clock rise-to-data output valid timing characteristics of integrated circuits (such as DRAM devices). DLLs can also be used for clock recovery. A DLL effectively functions as a negative-delay gate placed in the clock path of a digital circuit. A DLL compares the phase of one of its outputs to the input clock to generate an error signal which is then integrated and fed back as the control to all of the delay elements. A DLL is built around a delay chain composed of a number of delay gates connected in series. The input of the chain is connected to the clock that is to be delayed. A multiplexer is connected to each stage of the delay chain, and a selector of the multiplexer is automatically updated by a control circuit to produce the delay effect. The output of the DLL is the resulting, delayed clock signal. The phase shift can be specified either in absolute terms (in delay chain gate units), or as a proportion of the clock period, or both.

Conventional phase detectors for use in DLL and similar phase-locked loop (PLL) devices are usually configured to detect 90 degree and 180 degree phase differences between two clock signals. Such phase detectors typically cannot efficiently detect other phase differences, such as 270 degree or 540 degree phase differences. As clock speeds increase, such as in present 5 GHz applications, the number of components in the delay chain also increases. The DLL monitors and controls the clocking of these components. The short clock periods and number of devices can increase timing variations due to effects such as process variations, supply voltage variations, temperature and other environmental effects (collectively, the "PVT" effect). In general, a delay of only 90 degrees is often too short a period of time to accommodate all of the delay elements that are to be regulated. That is, accommodating all of the delay elements in order to have a constant delay across the PVT range may result in a total delay that is larger than 90 degrees.

What is desirable, therefore, is a phase detector that can detect greater than 90 or 180 degrees.

What is further desirable is a phase detector that can detect substantially 270 degree and 540 degree phase differences between two clock signals.

BRIEF DESCRIPTION OF THE DRAWINGS

Embodiments are illustrated by way of example and not limitation in the figures of the accompanying drawings, in which like references indicate similar elements and in which:

FIG. 3 is a table that lists sample output signals for the timing diagram of FIG. 1, under an embodiment.

DETAILED DESCRIPTION

Embodiments of the invention as described herein provide a solution to the problems of conventional methods as stated above. In the following description, various examples are given for illustration, but none are intended to be limiting. Embodiments include implementing a phase detector for a delay-locked loop (DLL) circuit that is operable to detect a substantially 270 degree and a substantially 540 degree phase differences between two clock signals. In an embodiment, a delay-locked loop circuit comprises a delay line receiving a system clock signal and generating a 270 degree phase shifted clock signal and a 540 degree phase shifted clock signal, a phase detector receiving the system clock signal and 270 degree phase shifted clock signal, and configured to generate corresponding up and down signals upon detection of a phase shift of 270 degrees between the system clock signal and the 270 degree phase shifted clock signal, a charge pump coupled to the phase detector, and configured to receive the up and down signals and generate a control signal responsive to thereto, and a regulator circuit to receive the control signal from the charge pump and generate a voltage control signal to the delay chain to control delay of the system clock signal. Although embodiments are directed to 270 degree and 540 degree phase shifts, it should be noted that slight variations in actual phase shift frequencies are possible such that the actual phase shift may be 270 degrees or 540 degrees plus or minus a certain variation or tolerance, such as ±5 degrees.

Figure 1:
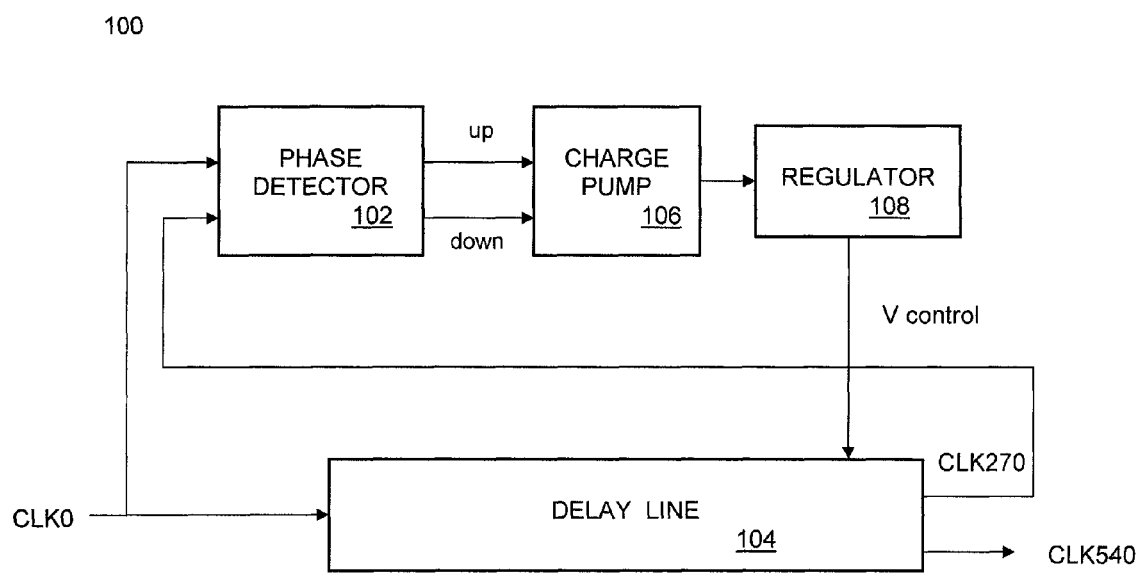
FIG. 1 is a block diagram of a delay-locked loop (DLL) circuit including a 270/540 degree phase detector, under an embodiment.

FIG. 1 is a block diagram of a delay locked loop circuit including a 270/540 degree phase detector, under an embodiment. The DLL circuit 100 is generally used to generate the phases of the system clock by precisely delaying the travel of clock transitions down a line of delay elements in delay line 104. The delay is controlled by circuitry which compares the input clock with the output of the delay line and adjusts the delay of the delay elements until they match, until the total delay of the delay line is one clock period, or any desired fraction of a clock period. For the embodiment of FIG. 1, the control circuitry comprises a phase detector (or phase frequency detector) 102, charge pump 106, and a regulator 108.

The delay line 104 receives a system clock signal, CLK0, and includes a number of delay elements that allows the clock signal through the delay line stage to be controlled, such as by a control voltage $V_{control}$ from regulator 108. The delay elements within the delay line may be any type of appropriate inverter device, such as a current starved inverter. The regulator 108 may be implemented as a loop filter that provides the voltage control signal to delay line 104.

For the embodiment of FIG. 1, the delay line generates a 540 degree phase clock signal CLK540 and a 270 degree phase clock signal CLK270. These phase shifted clock signals are generated through the detection and control functions provided by phase detector 102 and charge pump 106, which drive regulator 108 to provide the appropriate control voltage signal to delay line 104. The phase detector 102 receives the system CLK0 signal and the delay line output CLK270 signal as inputs. The phase detector 102 is an edge-sensitive, 270 degree locking detector such that when the input clock signals have identical duty cycle, there will be a 270 degree phase difference between the rising edges of the inputs.

In one embodiment, the charge pump 106 supplies charge amounts in proportion to the phase error detected by phase detector 102. The charge pump is an electronic circuit that uses capacitors as energy storage elements to create either a higher or lower voltage power source. In general, the charge pump can double voltages, triple voltages, invert voltages, fractionally multiply or scale voltages, and generate arbitrary voltages, depending on the controller and circuit topology. In the DLL system 100 the phase difference detected by phase detector 102 between the reference signal CLK0 and the output signal CLK270 from the delay line is translated into two signals—UP and DOWN. The two signals control switches to steer current into or out of a capacitor, causing the voltage across the capacitor to increase or decrease (hence the names of the signals). A low-pass filter is placed in parallel with the capacitor to smooth out abrupt changes on the capacitor's voltage and to ensure closed-loop stability. The output of the charge pump is used to tune the regulator 108.

Figure 2:
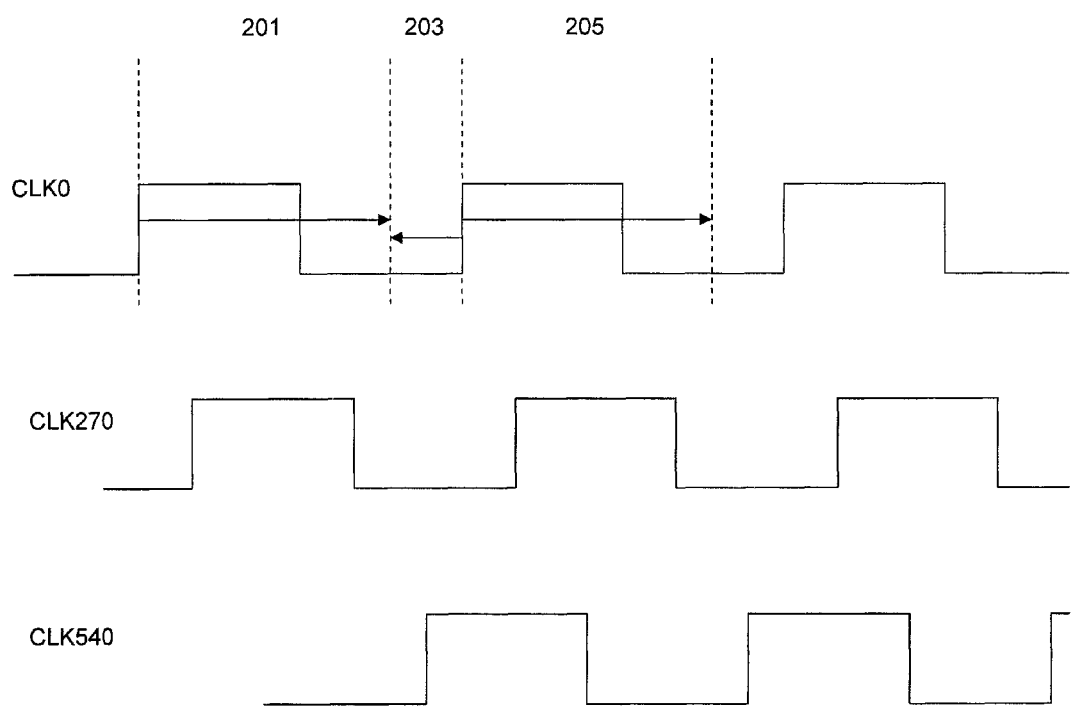
FIG. 2 is a timing diagram that illustrates the use of 270 degree and 540 degree clock signals to sample a reference clock signal, under an embodiment.

As shown in FIG. 1, the delay line 104 generates both 270 and 540 degree phase clock signals to sample the system clock signal CLK0. FIG. 2 is a timing diagram that illustrates the use of 270 degree and 540 degree clock signals to sample a reference clock signal, under an embodiment. FIG. 2 illustrates the relative pulse positions for clock signals CLK0, CLK270, and CLK540. The CLK270 signal is a quadrature clock of CLK0. Quadrature signaling is commonly used in communication systems wherein two signals are used to encode an information signal, each of the two signals being separated in phase by a quarter-cycle. To process these quadrature-phase signals, a quadrature clock is used, in which each of two clock signals are separated in phase by a quarter-cycle. A divide-by-four counter is commonly used to generate the quadrature clock signals.

As shown in FIG. 1, the phase detector 102 generates up and down signals to drive charge pump 106 to generate the control voltage through regulator 108. FIG. 3 is a table that lists sample output signals for the timing diagram of FIG. 1, under an embodiment. Table 300 illustrates the state of the phase detector output signals in terms of the UP and DOWN signals in accordance with states of the CLK270 and CLK540 signals for various phase differences between the CLK0 and CLK540 signals. As can be seen in FIG. 3, the phase detector 102 generates an UP signal only in the case where there is a 540 to 720 degree phase difference between the CLK0 and CLK540 clock signals. For all other phase differences, the phase detector will generate an UP signal.

Figure 4:
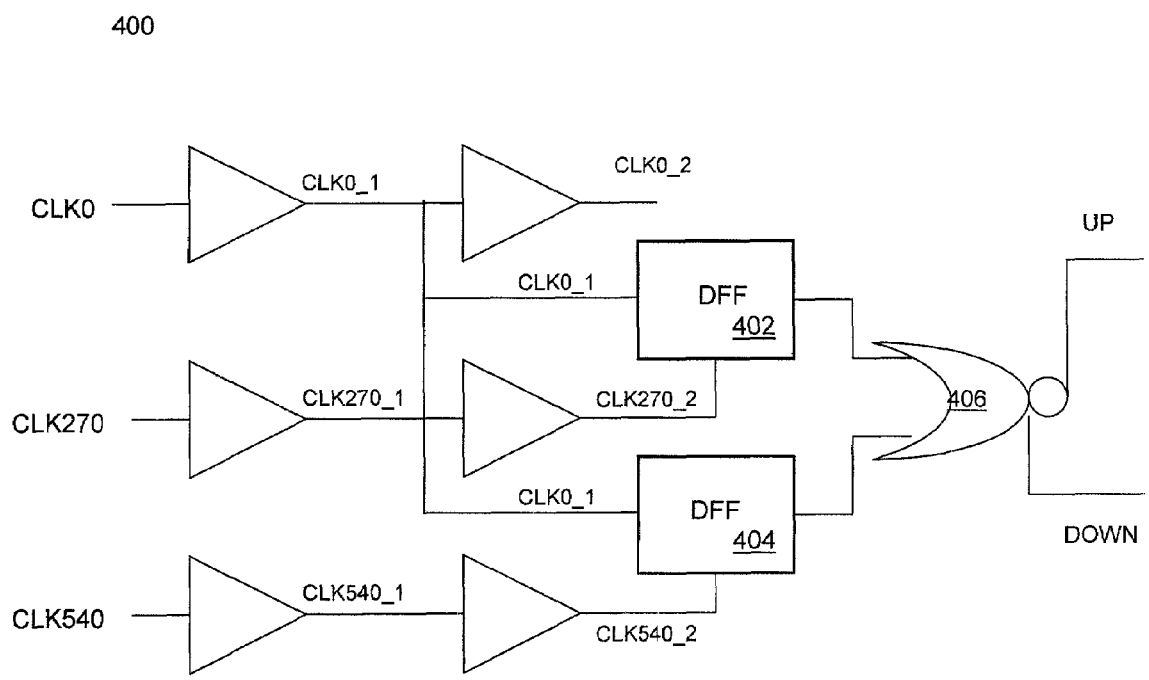
FIG. 4 is a circuit diagram of a 270/540 degree phase detector for use in the DLL circuit of FIG. 1, under an embodiment.

In one embodiment, the phase detector 102 is an edge-triggered phase detector that that locks when there is a 270 degree phase difference between the rising edges of the inputs. In a digital circuit embodiment, the phase detector may use a simple state machine to determine which of the two input signals, CLK0 and CLK270 has a zero-crossing earlier or more often. FIG. 4 is a circuit diagram of a 270/540 degree phase detector for use in the DLL circuit of FIG. 1, under an embodiment. As shown in circuit 400, the system clock signal CLK0 is input through a first inverter to generate a CLK0_1 signal, and a second inverter to generate a CLK0_2 signal. Likewise, the 270 degree clock signal CLK270 is input through a first inverter to generate a CLK270_1 signal, and a second inverter to generate a CLK270_2 signal, and the 540 degree clock signal CLK540 is input through a first inverter to generate a CLK540_1 signal, and a second inverter to generate a CLK540_2 signal. The CLK0_1 and CLK270_2 signals are input into a D flip-flop (DFF) circuit 402, and the CLK0_1 and CLK270_2 signals are input into a second D flip-flop circuit 404. Each D flip-flop functions as a zero-order hold circuits that captures the signal at the moment of a rising clock edge. The outputs of the DFF circuits 402 and 404 are input to a NOR gate 406. The NOR gate 406 acts as a decoder and the inverted output of the NOR gate provides an UP signal to the charge pump 106, and the non-inverted output provides the DOWN signal to the charge pump The phase detector circuit 400 is configured to detect differences in clock input frequencies of 270 degrees, or any multiple thereof, such as 540 degrees, 810 degrees, and so on, and any approximation of these frequencies (e.g., within a defined tolerance).

Although embodiments have been described with respect to implementation in a DLL device, it should be noted that alternative embodiments can be used in phase-locked loop (PLL) circuits. In general, a PLL includes a voltage-controlled oscillator (VCO) to generate a signal that has a fixed relation to the phase of the reference signal. Unlike DLL's, which do not have the ability to oscillate at a range of frequencies, PLL's generate their own clock by using a ring oscillator whose frequency of oscillation is adjusted to match a given input clock.

Embodiments of the phase detector for use with a DLL circuit or PLL circuit can be used in any application in which the delay of a distributed clock signal needs to be controlled. Such applications can include input/output transceiver circuits, communication links, processors, processing boards, bus-based distributed digital circuits, and other similar applications.

In general, embodiments of the 270/540 degree phase detector for use in DLL or PLL circuits can be directed to applications in which high speed clock signals need to be controlled. In high-speed clock distribution systems, it is important to maintain a constant delay for all circuits throughout an entire range of possible timing variations, such as due to PVT effects. In general, clock signals can vary in different parts of a circuit due to process variation (P), supply voltage (V) and/or operating temperature (T). In general, process variation accounts for deviations in the semiconductor fabrication process, such as impurity concentration densities, oxide thicknesses and diffusion depths, among others. Process variations can make propagation delay different among devices in a chip, because of size (thickness) differences, and other factors. Supply voltage variations can result from the fact that a design's supply voltage can vary from the established ideal value during day-to-day operation. The saturation current of a cell depends on the power supply, and the delay of a cell is dependent on the saturation current. Throughout a chip, the power supply is usually not constant and hence the propagation delay varies in a chip. Temperature variation is virtually unavoidable in the everyday operation of a design. When a chip is operating, the temperature can vary throughout the chip. This is due to the power dissipation in the transistor circuits. In general, propagation delay increases with increased temperature. The threshold voltage of a transistor also depends on the temperature. A higher temperature will decrease the threshold voltage.

Current delay lines that provide 90 or 180 degree delays are often inadequate for modern high speed circuits. In general, a delay of only 90 degrees is often too short a period of time to accommodate all of the delay elements that are to be regulated. Accommodating all of the delay elements in order to have a constant delay across the PVT range often results in a total delay that is larger than 90 degrees. In this case, a 90 or 180 degree delay circuit will be insufficient. For example, for a 2.5 GHz clock signal, the clock period is 400 picoseconds (ps), and the phase detector would lock on a 100 ps period (90 degrees). At 270 degrees, however, the detector locks on a 300 ps period. In this case, the period is three times as long as for the 90 degree phase detector, and hence a greater number of delay elements can be regulated by the phase detector circuit.

Embodiments of the delay locked loop provide a circuit that is configured to accommodate a number of delay elements such that a substantially constant delay is provided in the system clock signal distributed to one or more distributed electronic circuits that may have timing variations due to one or more effects of process variation, supply voltage, and operating temperature.

Many present applications use high speed circuits on the order of 2.5 GHz and above. Examples include high-speed memory bus applications, and pipelined processors. One significant application is in the field of graphics systems comprising graphics process units (GPU) or visual processing units (VPU), which are dedicated or integrated graphics rendering devices for a processing system.

In one embodiment, the DLL (or PLL) system incorporating a substantially 270/540 degree phase detector is used in a GPU. Such as system can be part of a graphics processing system with a computing device that may be one of a personal computer, a workstation, a handheld computing device, a digital television, a media playback device, smart communication device, and a game console, or any other similar processing device.

The systems and/or components described herein may be implemented as one or more electronic circuits. Such circuits described herein can be implemented through the control of manufacturing processes and maskworks, which would be then used to manufacture the relevant circuitry. Such manufacturing process control and maskwork generation known to those of ordinary skill in the art include the storage of computer instructions on computer readable media including, for example, Verilog, VHDL or instructions in other hardware description languages.

Aspects of the system described herein may be implemented as hardware circuitry involving several different device processes. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the phase detector system is not intended to be exhaustive or to limit the embodiments to the precise form or instructions disclosed. While specific embodiments of, and examples for, circuits and components are described herein for illustrative purposes, various equivalent modifications are possible within the scope of the disclosed methods and structures, as those skilled in the relevant art will recognize.

The elements and acts of the various embodiments described above can be combined to provide further embodiments. These and other changes can be made to the disclosed system in light of the above detailed description.

In general, in the following claims, the terms used should not be construed to limit the disclosed method to the specific embodiments disclosed in the specification and the claims, but should be construed to include all operations or processes that operate under the claims. Accordingly, the disclosed structures and methods are not limited by the disclosure, but instead the scope of the recited method is to be determined entirely by the claims.

While certain aspects of the disclosed embodiments are presented below in certain claim forms, the inventors contemplate the various aspects of the methodology in any number of claim forms. For example, while only one aspect may be recited as embodied in machine-readable medium, other aspects may likewise be embodied in machine-readable medium. Accordingly, the inventor reserves the right to add additional claims after filing the application to pursue such additional claim forms for other aspects.

What is claimed is:

1. A circuit for controlling the delay of a clock signal in a system, comprising:
   a delay line receiving a system clock signal and generating a substantially 270 degree phase shifted clock signal;
   a phase detector receiving the system clock signal and the substantially 270 degree phase shifted clock signal, and configured to generate corresponding up and down signals upon detection of a phase shift of substantially 270 degrees between the system clock signal and the substantially 270 degree phase shifted clock signal, wherein the phase detector is an edge-triggered phase detector that locks when there is a substantially 270 degree phase difference between the rising edges of the system clock input and the substantially 270 degree phase shifted clock input;
   a charge pump coupled to the phase detector, and configured to receive the up and down signals and generate a control signal responsive to thereto; and
   a regulator circuit to receive the control signal from the charge pump and generate a voltage control signal to the delay chain to control delay of the system clock signal.

2. The circuit of claim 1 wherein the delay line comprises a plurality of delay elements, each delay element delaying the system clock signal by a defined fraction of the clock period.

3. The circuit of claim 2 wherein each delay element comprises a current starved inverter component.

4. The circuit of claim 1 wherein the regulator comprises a loop filter component.

5. The circuit of claim 1 wherein the charge pump supplies charge amounts in proportion to the phase error detected by the phase detector, and includes one or more capacitors as energy storage elements to create either a higher or lower voltage power source in accordance with the detected phase error.

6. The circuit of claim 1 wherein the phase detector includes a state machine to determine which input signal of the two input signals, CLK0 and CLK270, has a zero-crossing earlier or more often than the other input signal.

7. The circuit of claim 1 wherein the components comprise a delay locked loop that is configured to accommodate a number of delay elements such that a substantially constant delay is provided in the system clock signal distributed to one or more distributed electronic circuits that may have timing variations due to one or more effects of process variation, supply voltage, and operating temperature.

8. A non-transitory computer readable media storing computer readable instructions adapted to enable manufacture of a circuit adopted to delay a clock signal in a system comprising:

receiving a system clock signal on a delay line and generating a substantially 270 degree phase shifted clock signal;

receiving the system clock signal and the substantially 270 degree phase shifted clock signal on a phase detector, and generating up and down signals upon detection of a phase shift of substantially 270 degrees between the system clock signal and the substantially 270 degree phase shifted clock signal, and wherein the phase detector is an edge-triggered phase detector that locks when there is a substantially 270 degree phase difference between the rising edges of the system clock input and the substantially 270 degree phase shifted clock input;

receiving the up and down signals on a charge pump coupled to the phase detector and generating a control signal responsive to thereto; and receiving the control signal from the charge pump at a regulator circuit and generating a voltage control signal to the delay chain to control delay of the system clock signal.

9. The computer readable media of claim 8 wherein the computer readable instructions comprise hardware description language instructions.

\* \* \* \* \*